United States Patent
Sevenhans et al.

[11] Patent Number: 5,514,950
[45] Date of Patent: May 7, 1996

[54] DIFFERENTIAL PAIR ARRANGEMENT

[75] Inventors: Joannes M. J. Sevenhans, Brasschaat; Mark G. S. J. Van Paemel, Zoersel, both of Belgium

[73] Assignee: Alcatel N.V., Rijswijk, Netherlands

[21] Appl. No.: 213,594

[22] Filed: Mar. 15, 1994

[30] Foreign Application Priority Data

Mar. 16, 1993 [EP] European Pat. Off. .............. 93200759

[51] Int. Cl.$^6$ .................................. G05F 3/16; H03F 3/04
[52] U.S. Cl. .......................... 323/315; 323/312; 330/288; 330/257
[58] Field of Search .................................... 323/312, 315, 323/316, 317; 330/254, 257, 288, 301; 327/535, 538

[56] References Cited

U.S. PATENT DOCUMENTS

| | | | |
|---|---|---|---|
| 4,480,337 | 10/1984 | Graziadei et al. ........................ | 455/333 |
| 4,525,663 | 6/1985 | Henry ........................ | 323/315 |
| 4,814,724 | 3/1989 | Tanigawa ........................ | 330/288 |
| 5,099,205 | 3/1992 | Lewyn ........................ | 330/288 |
| 5,373,228 | 12/1994 | Holle ........................ | 323/315 |
| 5,374,897 | 12/1994 | Moraveji ........................ | 330/257 |
| 5,404,097 | 4/1995 | Barou ........................ | 323/312 |
| 5,424,681 | 6/1995 | Yotsuyanagi ........................ | 330/257 |

FOREIGN PATENT DOCUMENTS

| | | |
|---|---|---|
| 0040274 | 11/1981 | European Pat. Off. . |
| 0090329 | 10/1983 | European Pat. Off. . |
| 0356556 | 3/1990 | European Pat. Off. . |

OTHER PUBLICATIONS

Patent Abstract of Japan vol. 7, No. 107 (E–174) (1252) May 11, 1983 & JP-A-58 027 407 (Tokyo Shibaura Denki K.K.) 18 Feb. 1983 *abstract*.
Patent Abstract of Japan, vol. 6, No. 28 (E–95) (906) 19 Feb. 1982 & JP-A-56.149 803 (Fujitsu K.K.) 19 Nov. 1981 *abstract*.
Analysis and Design of Analog Integrated Circuits by P. R. Gray and R. G. Meyer, J. Wiley & Sons, New York, 1977.

*Primary Examiner*—Matthew V. Nguyen
*Attorney, Agent, or Firm*—Ware, Fressola, Van Der Sluys & Adolphson

[57] ABSTRACT

A differential pair arrangement is disclosed which includes between the poles of a DC supply source the series connection of two parallel first branches and a common second branch. Each first branch includes the series connection of a first impedance Q2, Q3, RL/ Q2', Q3', RL', a main path of a transistor Q1/ Q1'and a second impedance RE/RE', the control electrodes of transistors Q1/ Q1' constituting respective input terminals IN1/ IN2 of the arrangement. The second branch includes a first current source (CCS). The arrangement further includes two third branches between the DC supply source poles, each consisting of the series connection of a second current source ICS/ICS', a respective transistor main path and a resistive impedance means R11, S11, R12, S12/ R11', S11', R12', S12'. These third branches result in an increased DC current through the corresponding transistor, thereby increasing the linearity of the arrangement, whilst the DC current through the first and second impedances does not increase, thereby not increasing the needed supply voltage nor the offset voltage of the arrangement.

10 Claims, 1 Drawing Sheet

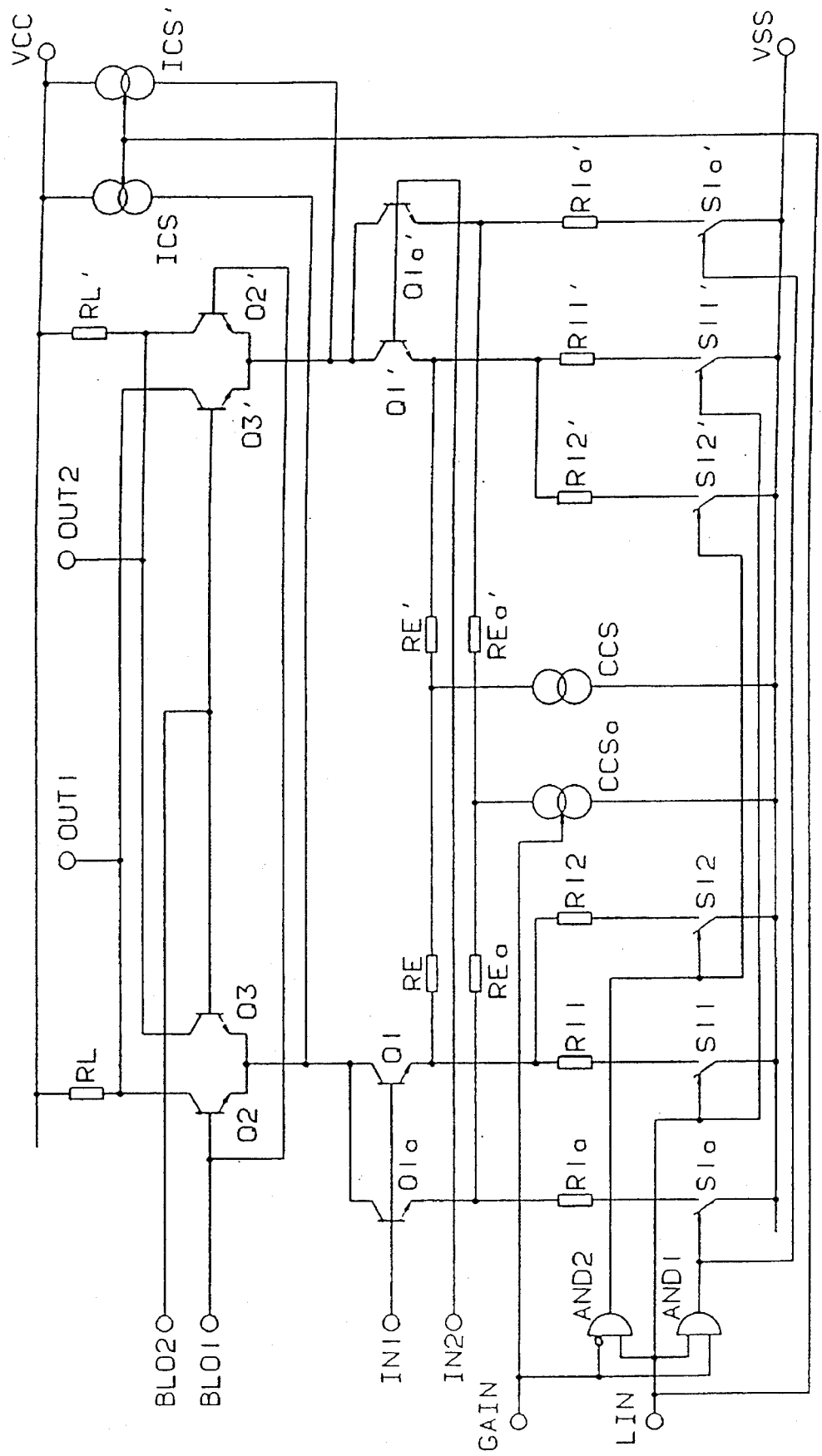

DIFFERENTIAL PAIR ARRANGEMENT

TECHNICAL FIELD

The present invention relates to a differential pair arrangement including between a first and a second pole of a DC supply source the series connection of two parallel individual first branches and a common second branch, each of said first branches including the series connection of a first impedance, a main path of a transistor and a second impedance, with the control electrodes of said transistors constituting respective input terminals of said differential pair arrangement, and said second branch including a common first current source.

BACKGROUND OF THE INVENTION

Such a differential pair arrangement is already known in the art, e.g. from the book 'Analysis and Design of Analog Integrated Circuits' by P. R. Gray and R. G. Meyer, J. Wiley & Sons, New York, 1977, and more particularly from FIG. 3.29 thereof. Therein, both the first and second impedances comprise resistors. More particularly, these second impedances are emitter degeneration resistor and cause the differential pair arrangement to operate with a lower distortion, i.e. with a higher operation linearity as they introduce feedback. Indeed, from the above book it follows that the open loop gain of the arrangement is equal to the product of the emitter degeneration resistor value and the so-called transconductance ($g_m$) of the transistors so that when this open loop gain, the distortion of the differential pair arrangement decreases and the operation linearity of this arrangement increases. This means that an increased linearity of the differential pair arrangement may be obtained by increasing either the emitter degeneration resistor value or the transconductance value. However, increasing the emitter degeneration resistor value also increases the so-called thermal noise introduced in the differential pair arrangement by this resistor, this thermal noise being proportional to the resistor value. On the other hand, increasing the transconductance value requires increasing the DC current through the transistors. However, because this DC current also flows through the first and the second impedances it produces additional DC voltage drops therein. Thus, increasing the DC current through the transistors implies providing a higher supply voltage for the differential pair arrangement. Secondly, producing a higher DC current through the transistors also increases the input offset voltage of the differential pair arrangement, since this input offset voltage is partly caused by the mismatch between the emitter degeneration resistors of both first branches, this mismatch resulting in an offset voltage equal to the product of the mismatch and the DC current through the emitter degeneration resistors.

SUMMARY OF THE INVENTION

Accordingly, an object of the present invention is to provide a differential pair arrangement of the above known type but operating with an increased linearity and substantially without additional noise or offset being introduced and substantially without a higher supply voltage being required.

According to the invention, this object is achieved due to the fact that said differential pair arrangement further includes two third branches each including between said first and second poles the series connection of an individual second current source, a respective one of said main paths and a resistive impedance means.

In this way, the DC current through each transistor is increased, thereby increasing its transconductance and therefore the operation linearity of the differential pair arrangement, as is clear from the above discussion of the prior art. On the other hand, the DC currents through the first impedances and the DC currents through the second impedances are substantially not increased since the increase in DC current through the transistors is provided by the second current sources and by the resistive impedance means. As a result, the voltage drops in the first and second impedances, and thereby the needed supply voltage, and the offset voltage of the differential pair arrangement are substantially not increased compared to the case where the second current sources and the resistive impedance means are not provided. Also, the second impedance is not changed, so that the thermal noise introduced by it is not modified.

It should be noted that European patent application EP 0 275 079 A2 already discloses a differential pair arrangement similar to the one of the present invention except for the second impedances and the resistive impedance means. However, the purpose of the second current sources used therein is not to improve the linearity of the differential pair arrangement but to increase its gain. Indeed, such linearity improvement requires the additional use of the second impedances to provide feedback, as without them the second current sources do not increase the linearity. Furthermore, merely introducing the second impedances in the differential pair arrangement of the mentioned patent application would still leave unsolved the already mentioned problems of an additional voltage drop across these second impedances and an increased offset voltage of the differential pair arrangement, both problems being due to the increased DC current through the second impedances, i.e. due to the current provided by the second current sources and flowing therethrough. These problems are only solved by the introduction of the resistive impedance means.

To be noted further that FIG. 3.54 of the above book by Gray discloses a differential pair arrangement with two common first current sources and one second impedance or emitter degeneration resistor instead of one common first current source and two second impedances. Thereby, the DC current provided by the two common first current sources does not flow through the single second impedance as a result of which no DC voltage drop occurs across this second impedance and also no offset voltage due to a mismatch in the second impedances is introduced. However, when the currents generated by the two common first current sources are not equal an additional offset voltage is introduced. Furthermore, when the common first current sources include an active element then a parasitic capacitance generally part of this element is branched in parallel with each of the two common first current sources. As a result, at high frequencies the junction points between the transistors of the arrangement and the second impedances is connected to the second pole (ground) of the supply source via a low impedance so that the feedback introduced in the arrangement by these second impedances is reduced and thereby, as is clear from the discussion of the prior art, also the linearity of the arrangement is reduced. In the present arrangement this is avoided because the resistive impedance means have no parasitic capacitance. It should be noted that a parasitic capacitance present in the common first current source of the present invention does not produce a reduction of the bandwidth since, due to the symmetry of the arrangement a substantially constant voltage occurs at the common junction point between the two second impedances when a signal with a substantially constant common mode voltage is applied across the input terminals.

A further feature of the present invention is that said differential pair arrangement further includes between said first and second poles the series connection of two parallel individual fourth branches and a common fifth branch, and two additional sixth branches, each of said fourth branches including the series connection of said first impedance, a main path of a second transistor and a third impedance, with the control electrode of the respective second transistors connected to the respective ones of said input terminals, said fifth branch including a common third current source, each of said sixth branches consisting of the series connection of a respective one of said second current sources, a respective one of said second transistor main paths and a second resistive impedance means, said second resistive impedance means and said third current source being adapted so as to be able to be cut off by a gain control signal.

In this way, and with reference to the case where the second resistive impedance means and the third current source are cut off by the gain control signal, a gain increase of the differential pair arrangement is obtained when this second resistive impedance means and this third current source conduct current since in that case the second transistors are made active. When the first mentioned and the second transistor connected to the same first impedance have the same characteristics this gain increase is substantially equal to 6 dB (factor 2).

Still another feature of the present invention is that at least one of said resistive impedance means includes a resistor.

In this way, the parasitic capacitance of the resistive impedance means is kept optimally low.

Yet a further feature of the present invention is that the total current flowing through the respective ones of said resistive impedance means belonging to branches with a same second current source, substantially equals the current provided by said same second current source.

Since the increase in DC current flows neither through the first impedance nor through the second impedance, neither the voltage drops, and thereby also not the needed supply voltage, nor the offset voltage of the differential pair arrangement are increased. To be noted that for the differential pair arrangement with the possibility of gain increase, the sum of the currents through the first mentioned and the second resistive impedance means must be equal to the current provided by the second current source, whilst for a differential pair arrangement without the possibility of gain increase, the current through the first mentioned resistive impedance means must be equal to the current provided by the second current source.

Yet a further feature of the present invention is that at least one of said second current sources and resistive impedance means is controlled by a linearity control signal tuning the current provided by them.

In this way, the transconductance ($g_m$) of the first and/or second transistor, which is partly determined by the current provided by the second current sources and by the current through the resistive impedance means, these currents being controlled by the linearity control signal, is tuned by this linearity control signal, thereby influencing the linearity of the differential pair arrangement as is clear from the above discussion of the prior art. Indeed, an increased current supplied by the second current sources or the resistive impedance means and flowing through the transistors causes the transconductance ($g_m$) to increase, thereby increasing the linearity of the differential pair arrangement. On the other hand, a decreased current decreases the linearity of the differential pair arrangement but also decreases power requirements from the constant voltage source. Minimal power requirements are obtained by disconnecting or cutting off the second current sources and the resistive impedance means.

Still another characteristic feature of the invention is that at least one of said first, second and third current sources is adapted to supply a current which increases with increasing temperature.

As known in the art, the transconductance ($g_m$) is inversely proportional to the temperature. This negative temperature coefficient is compensated by the increase in the current provided by one of the current sources with increasing temperature, thereby reaching a substantially constant linearity over a wide temperature range. To be noted that such current sources with positive temperature coefficient are also known as PTAT (Proportional To Absolute Temperature) current sources.

Another characteristic feature of the present invention is that said first impedance of each of said first branches includes two parallel seventh branches, a first one of which includes the series connection of a load impedance and a main path of a third transistor, and a second one of which includes the series connection of the load impedance included in the other one of said first branches, and a main path of a fourth transistor, the control electrodes of said third transistors of both said seventh branches being interconnected as well as those of said fourth transistors and constituting respective third and fourth input terminals of said differential pair arrangement, the junction points of the load impedances with the respective third transistors constituting respective first and second output terminals of said differential pair arrangement, and that a signal with a substantially constant common mode voltage is applied across said third and fourth input terminals.

Thereby, the differential pair arrangement is similar to a so-called Gilbert cell as known in the art e.g. from the above mentioned book by Gray, more in particular from FIG. 10.10 thereof. The control electrodes of the second and third transistor of each seventh branch being driven by the signal with substantially constant common mode voltage, the voltage at the junction points between these transistors is also substantially constant and equal to this common mode voltage. Thereby, the second current source can be implemented in a simple way.

Such a simple implementation of the second current source is for instance obtained through the fact that said second current source is constituted by a resistor.

Since the voltage at the junction point between the second and the third transistors is substantially constant as discussed above, the resistor between this junction point and the first pole of the constant voltage source provides a substantially constant current.

BRIED DESCRIPTION OF THE DRAWING

The above mentioned and other objects and features of the invention will become more apparent and the invention itself will be best understood by referring to the following description of an embodiment taken in conjunction with the single accompanying drawing which shows a differential pair arrangement or differential pair according to the invention.

BEST MODE FOR CARRYING OUT THE INVENTION

In this drawing a differential pair similar to a so-called Gilbert cell is shown. As already mentioned above such a Gilbert cell is known in the art and e.g. described in the book by Gray. The differential pair is used to modulate a carrier signal having a substantially constant common mode voltage provided across input terminals BL01, BL02, with a modulating signal provided across input terminals IN1, IN2, thereby obtaining a modulated output signal across output terminals OUT1, OUT2. The differential pair has a double input circuit one part of which can be cut off as will become clear hereinafter, whereby the arrangement is switched from a high gain mode to a low gain mode. Furthermore, as will also become clear hereinafter, the differential pair also includes means to switch between a high linearity mode and a low linearity mode. The high gain mode and the high linearity mode result in increased power requirements compared to the low gain and low linearity modes, respectively.

In the following all transistors are bipolar npn type transistors.

The differential pair includes between a first pole VCC and a second pole VSS of a DC supply source providing respective like named positive and negative supply voltages, the series connection of a load impedance or resistor RL, the collector emitter paths of a transistor Q2 and of a transistor Q1, a resistor R11 and a switch S11, and, parallel thereto, the series connection of a load impedance or resistor RL', the collector emitter paths of a transistor Q2' and of a transistor Q1', a resistor R11' and a switch S11'. Parallel to R11 and S11 the series connection of a resistor R12 and a switch S12 is connected, and parallel to R11' and S11' the series connection of a resistor R12' and a switch S12'. The collector of Q2' and the emitter of Q2 are interconnected via the collector emitter path of a transistor Q3, whereas the collector of Q2 and the emitter of Q2' are interconnected via the collector emitter path of a transistor Q3'. The bases of Q2 and Q2' are interconnected and constitute the input terminal BL01, whilst the bases of Q3 and Q3' are interconnected and constitute the input terminal BLO2. The collector of Q2 constitutes the output terminal OUT1 and the collector of Q2' constitutes the output terminal OUT2. The collector of Q1 is connected to VCC via an individual current source ICS and to VSS via the series connection of the collector emitter path of a transistor Q1a, a resistor R1a and a switch S1a, whereas the collector of Q1' is connected to VCC via an individual current source ICS' and to VSS via the series connection of the collector emitter path of a transistor Q1a', a resistor R1a' and a switch S1a'. The emitters of Q1 and Q1' are interconnected via the series connection of two resistors RE and RE' the connecting node of which is connected to VSS via a common current source CCS. Similarly, the emitters of Q1a and Q1a' are interconnected via the series connection of two resistors REa and REa' the connecting node of which is connected to VSS via a common current source CCSa. The bases of Q1 and Q1a are interconnected and constitute the input terminal IN1, whereas the bases of Q1' and Q1a' are interconnected and constitute the input terminal IN2. The individual current sources ICS and ICS' as well as the switches S11 and S11' are controlled by a binary linearity control signal LIN, and the common current source CCSa by a binary gain control signal GAIN. The signal LIN is also applied to a non-inverting first input of a logical AND-gate AND1 and to a non-inverting first input of a logical AND-gate AND2, whereas the signal GAIN is also applied to a non-inverting second input of AND1 and to an inverting second input of AND2. An output of AND1 controls the switches S1a and S1a', and an output of AND2 controls the switches S12 and S12'. The switches are closed and the current sources provide current when their controlling signals are high, i.e. constitute a voltage equal to VCC, whereas the switches are open and the current sources cut off when their controlling signals are low, i.e. constitute a voltage equal to VSS. It should be noted that the respective combinations of R11 and S11, R12 and S12, R1a and S1a, R11' and S11', R12' and S12', and R1a' and S1a' constitute resistive impedance means.

The operation of the differential pair is now described with reference to the drawing.

The operation is similar to that of a Gilbert cell as known in the art and described for instance in the already mentioned book by Gray on pp. 563–575 thereof. In short, the lower degenerated emitter coupled pair Q1, Q1', RE, RE' (and/or Q1a, Q1a', REa, REa') produces differential output collector currents proportional to the differential input voltages of the modulating signal applied across the inputs IN1, IN2. These collector currents are via transistors Q2, Q3, and Q2', Q3', respectively, led through resistors RL and RL' depending on the carrier signal applied to the inputs BL01, BL02. When this carrier signal is for instance a square wave signal, the collector currents of transistors Q1 and Q1' (and/or Q1a and Q1a') are each led either through RL or RL'. In this way, a modulated output signal across the outputs OUT1, OUT2 is obtained which is the product of the modulating signal applied across IN1, IN2 and the carrier signal applied across BL01, BL02.

In the following, the above mentioned low gain mode is first considered, i.e. the gain control signal GAIN is put to VSS thereby cutting the current source CCSa and, since GAIN being low causes the output of AND1 to be low, opening the switches S1a and S1a' as a result of which the degenerated emitter coupled pair Q1a, Q1a', REa, REa' is cut off. Furthermore, the linearity control signal LIN cuts off ICS and ICS' or puts them in operation, and, since the output of AND2 is equal to this signal LIN, it opens or closes all four switches S11, S12, S11', S12' together, with open switches corresponding to cut off current sources ICS and ICS'. In a first instance the low linearity mode is considered, i.e. LIN is put to VSS thereby cutting off ICS and ICS' and opening the latter switches S11, S12, S11', S12'.

One can show that the gain of the differential pair is given by the following equation in which $V_{out1}$ is the voltage at OUT1, $V_{out2}$ is the voltage at OUT2, $V_{in1}$ is the voltage at IN1, $V_{in2}$ is the voltage at IN2, R1=RL=RL', Re =RE=RE' and $g_m$ is equal to the so-called transconductance of transistor Q1 which is assumed equal to that of transistor Q1'.

$$\frac{V_{out1} - V_{out2}}{V_{in1} - V_{in2}} = \frac{-g_m \times Rl}{1 + g_m \times Re}$$

This equation is valid as long as the transconductances $g_m$ of Q1 and Q1' are equal. Hence, since $g_m = I/V_t$, where I is the DC current through the transistor and $V_t = k \times T/q$ in which k is Boltzmann's constant, T is the absolute temperature in K and q is the electron charge, the gain depends upon the DC current through Q1 and Q1' and upon the symmetry of the differential pair. In order to avoid this dependence, i.e. in order to improve the linearity of the differential pair, the gain is made less dependent upon the transconductance $g_m$ by increasing $g_m \times Re$ so that $1 < g_m \times Re$ and the gain becomes equal to −Ri/Re.

In the present invention the linearity can be increased by increasing $g_m$, instead of Re whose increase would introduce additional thermal noise in the differential pair. This increase in $g_m$ is obtained by putting the linearity control signal LIN to a binary high value, i.e. to VCC thereby entering the high linearity mode. As a result, ICS and ICS' provide current to the differential pair, the switches S11 and S11' are closed, and, the signal GAIN still being low, the output of AND2 is high, thereby closing switches S12 and S12'. Consequently, when the current provided by ICS (ICS') is equal to the total current flowing through R11 and R12 (R11' and R12'), the DC current through Q1 (Q1') is increased although the increase in this DC current does not flow through RE nor RL (RE' nor RL'). Thereby, the DC voltage drops across RE, RL, RE' and RL' are not increased so that the supply voltage which is given by VCC minus VSS need not be increased. Furthermore, a mismatch between the resistors RE and RE' introduces an offset voltage equal to the product of the difference between the values of RE and RE' and the DC current therethrough. This offset voltage is not increased by the increased DC current through Q1 and Q1'.

It is to be noted here that since the carrier signal applied across BL01, BL02 has a substantially constant common mode voltage, the voltage at the collectors of both Q1 and Q1' is also substantially constant. Consequently, the current sources ICS and ICS' can be implemented as a simple resistor, which is however not shown in the drawing. To be noted that such implementation has the additional advantage that no parasitic capacitances are introduced by it. Furthermore, one can easily cut off the current provided by them by disconnecting them, e.g. by means of a single switch via which interconnected respective ends of these resistors are connected to VCC. In that case and when disconnected, i.e. when the interconnected ends are floating, the resistors introduce a small load on the arrangement. When the carrier signal does not have a substantially constant common voltage or in the case where the differential pair is not implemented in a way similar to a Gilbert cell, i.e. when Q2, Q3, Q2' and Q3' are not present and the collectors of Q1 and Q1' are connected to VCC via RL and RL', respectively, then the current sources ICS and ICS can be implemented as known in the art and described for instance in the above book by Gray on pp. 197–210 thereof.

When the values of R11 and R12 (R11' and R12') are large compared to RE (RE'), R11 and R12 (R11' and R12') provide only a limited AC load on the differential pair, i.e. the current through R11 and R12 (R11' and R12') is substantially a DC current. This DC current is equal to the quotient of the common mode voltage of the modulating signal applied to IN1, IN2 minus the base emitter voltage drop, and the total resistor value of the parallel resistors R11 and R12 (R11' and R12'). The resistor values of R11, R12, R11' and R12' have to be chosen in such a way that the latter DC currents equal the current provided by ICS and ICS', respectively.

So far, the signal GAIN was low as a result of which no current flows through transistors Q1a and Q1a'. In that case, the gain of the differential pair is given by −R1/Re. In order to increase the gain, i.e. in order to enter the high gain mode, the signal GAIN is put to VCC so that current source CCSa conducts current and, the output of AND2 being low, switches S12 and S12' are opened. When the signal LIN is low, current sources ICS and ICS' are cut off and switches S1a, S1a', S11 and S11' are also opened, whereby the differential pair operates in the low linearity mode. When the transistors Q1a and Q1a' have the same characteristics as Q1 and Q1', then for the same value of the modulating signal across IN1, IN2, the total current provided to the resistors RL and RL' is increased by a factor two, i.e. the gain is doubled (6 dB gain increase).

When, GAIN still being high, the signal LIN is also high, then ICS and ICS' conduct current, this current being the same as when GAIN was low, and S11, S11', S1a, S1a' are closed. Switches S12 and S12' are still open. When R1a is equal to R12 (R1a' to R12' ) the total current provided by ICS (ICS') is equal to the total current through R11 and R1a (R11' and R1a'), which follows from the above discussion of the case where GAIN was low since the current flowing through R12 (R12') when GAIN was low now flows through R1a (R1a'). Thereby, increased voltage drops in RL, RL', RE, RE', REa and REa' and an increased offset voltage are avoided.

As is clear from the above, the linearity of the differential pair depends on the transconductance $g_m$ which is inversely proportional to the temperature. This negative temperature dependency is compensated by implementing CCS and CCSa, and possibly ICS and ICS' when they are implemented by means of active elements and not by means of a resistor, as so-called PTAT (Proportional To Absolute Temperature) current sources the current of which increases with increasing temperature. Such PTAT current sources are for example described in the book by Gray on pp. 245–248 thereof.

While the principles of the invention have been described above in connection with specific apparatus, it is to be clearly understood that this description is made only by way of example and not as a limitation on the scope of the invention.

We claim:

1. A differential pair arrangement included between a first (VCC) and a second (VSS) pole of a DC supply source the series connection of two parallel individual first branches and a common second branch, each of said first branches including the series connection of a first impedance (Q2, Q3, RL/Q2', Q3', RL'), a main path of a transistor (Q1/Q2') and a second impedance (RE/RE'), with the control electrodes of said transistors (Q1/Q1') constituting respective input terminals (IN1/IN2) of said differential pair arrangement, and said second branch including a common first current source (CCS), characterized in that it further includes between said first (VCC) and second (VSS) poles two third branches, the series connection of two parallel individual fourth branches, a common fifth branch, and two sixth branches, each of said third branches including the series connection of an individual second current source (ICS/ICS'), a respective one of said main paths and a resistive impedance means (R11, S11, R12, S12/R11', S11', R12', S12') each of said fourth branches including the series connection of said first impedance (Q2, Q3, RL/Q2', Q3', RL'), a main path of a second transistor (Q1a Q1a') and a third impedance (REa/REa'), with the control electrode of the respective second transistors (Q1a/Q1a') connected to the respective ones of said input terminals (IN1/IN2), said fifth branch including a common third current source (CCSa), and each of said sixth branches consisting of the series connection of a respective one of said second current sources (ICS/ICS'), a respective one of said second transistor main paths and a second resistive impedance means (R1a, S1a/R1a', S1a'), said second resistive impedance means (R1a, S1a/R1a', S1a') and said third current source (CCSa) being sized so as to be able to be cut off by a gain control signal (GAIN).

2. A differential pair arrangement according to claim 1 characterized in that at least one of said resistive impedance means (R11, S11, R12, S12; R11', S11'; R12', S12'; R1a, S1a; R1a', S1a') includes a resistor (R11, R12, R11', R12', R1a, R1a').

3. A differential pair arrangement according to claim 1 characterized in that the total current flowing through the respective ones of said resistive impedance means (R11, S11, R12, S12, R1a, S1a /R11', S11', R12', S12', R1a', S1a') belonging to branches with a same second current source (ICS/ICS'), substantially equals the current provided by said same second current source (ICS/ICS').

4. A differential pair arrangement according to claim 1 characterized in that at least one of said second current sources (ICS, ICS') and resistive impedance means (R11, S11, R12, S12; R1a, S1a; R11', S11', R12', S12'; R1a', S1a') is controlled by a linearity control signal (LIN) tuning the current provided by them.

5. A differential pair arrangement according to claim 1, characterized in that at least one of said first, second and third current sources (CCS, ICS, ICS', CCSa) includes means for supplying a current which increases with increasing temperature.

6. A differential pair arrangement according to claim 1, characterized in that said first impedance (Q2, Q3, RL/Q2', Q3', RL') of each of said first branches includes two parallel seventh branches, a first one of which includes the series connection of a load impedance (RL/ RL') and a main path of a third transistor (Q2/ Q2'), and a second one of which includes the series connection of the load impedance (RL'/ RL) included in the other one of said first branches, and a main path of a fourth transistor (Q3/ Q3'), the control electrodes of said third transistors (Q2/ Q2') of both said seventh branches being interconnected as well as those of said fourth transistors (Q3/ Q3') and constituting respective third and fourth input terminals (BL01, BL02) of said differential pair arrangement, the junction points of the load impedances (RL/ RL') with the respective third transistors (Q2/ Q2') constituting respective first and second output terminals (OUT1/ OUT2) of said differential pair arrangement, and that a signal with a substantially constant common mode voltage is applied across said third and fourth input terminals (BL01, BL02).

7. A differential pair arrangement according to claim 6, characterized in that a modulating signal is applied across said first and second input terminals (IN1, IN2), thereby producing across said first and second output terminals (OUT1, OUT2) a modulated signal which is the product of said modulating signal and said first mentioned signal.

8. Differential pair arrangement according to claim 6, characterized in that said second current source (ICS/ ICS') is constituted by a resistor.

9. A differential pair arrangement according to claim 6, characterized in that said transistors (Q1, Q1', Q1a, Q1a', Q2, Q2', Q3, Q3') are bipolar transistors, said main paths being constituted by the collector emitter path thereof and said control electrodes being constituted by the base thereof.

10. A differential pair arrangement according to claim 1, characterized in that said transistors (Q1, Q1', Q1a, Q1a', Q2, Q2', Q3, Q3') are bipolar transistors, said main paths being constituted by the collector emitter path thereof and said control electrodes being constituted by the base thereof.

* * * * *